United States Patent
Bhargava et al.

(10) Patent No.: US 10,373,680 B2
(45) Date of Patent: Aug. 6, 2019

(54) CONTROLLING CURRENT THROUGH CORRELATED ELECTRON SWITCH ELEMENTS DURING PROGRAMMING OPERATIONS

(71) Applicant: ARM Ltd., Cambridge (GB)

(72) Inventors: Mudit Bhargava, Austin, TX (US);
Glen Arnold Rosendale, Palo Alto, CA (US); Akshay Kumar, New Delhi (IN);
Piyush Agarwal, Noida (IN);
Shidhartha Das, Upper Cambourne (GB)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/590,987

(22) Filed: May 9, 2017

(65) Prior Publication Data
US 2018/0330784 A1    Nov. 15, 2018

(51) Int. Cl.
*G11C 11/00*    (2006.01)
*G11C 13/00*    (2006.01)

(52) U.S. Cl.
CPC ...... *G11C 13/0069* (2013.01); *G11C 13/0007* (2013.01); *G11C 2013/0078* (2013.01); *G11C 2213/74* (2013.01); *G11C 2213/79* (2013.01)

(58) Field of Classification Search
CPC ................................................ G11C 13/0069
USPC ................ 365/148, 151, 225.7, 158, 189.01
See application file for complete search history.

(56) References Cited

U.S. PATENT DOCUMENTS

| | | | |
|---|---|---|---|
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz de Araujo et al. | |
| 7,961,507 B2 * | 6/2011 | Liu ...................... | H01L 27/2463 257/2 |
| 9,514,814 B1 * | 12/2016 | Sandhu ............. | G11C 13/0069 |
| 9,558,819 B1 | 1/2017 | Aitken et al. | |
| 9,584,118 B1 | 2/2017 | Dao et al. | |
| 9,589,636 B1 | 3/2017 | Bhavnagarwala et al. | |
| 9,627,615 B1 | 4/2017 | Reid et al. | |
| 9,755,146 B2 * | 9/2017 | Shifren ................. | H01L 49/003 |
| 2007/0217252 A1 | 9/2007 | Symanczyk | |
| 2008/0106926 A1 * | 5/2008 | Brubaker ............ | H01L 27/2409 365/148 |
| 2008/0107801 A1 | 5/2008 | Celinska et al. | |
| 2011/0038195 A1 | 2/2011 | Hamilton | |
| 2013/0200323 A1 | 8/2013 | Pham et al. | |
| 2013/0214232 A1 | 8/2013 | Tendulkar et al. | |
| 2013/0285699 A1 | 10/2013 | McWilliams et al. | |
| 2016/0240251 A1 | 8/2016 | Shih | |
| 2017/0033782 A1 | 2/2017 | Shifren | |

(Continued)

FOREIGN PATENT DOCUMENTS

WO    2009/140299 A2    11/2009

OTHER PUBLICATIONS

PCT/GB2018/051200: International Search Report and Written Opinion, dated Jul. 19, 2018, 15 pages.

*Primary Examiner* — Connie C Yoha
(74) *Attorney, Agent, or Firm* — Berkeley Law & Technology Group, LLP

(57) ABSTRACT

Subject matter disclosed herein may relate to correlated electron switch elements and, more particularly, to controlling current through correlated electron switch elements during programming operations.

20 Claims, 9 Drawing Sheets

(56) References Cited

U.S. PATENT DOCUMENTS

| | | |
|---|---|---|
| 2017/0045905 A1 | 2/2017 | Sandhu et al. |
| 2017/0047116 A1 | 2/2017 | Sandhu et al. |
| 2017/0047919 A1 | 2/2017 | Sandhu et al. |
| 2017/0069378 A1 | 3/2017 | Shifren et al. |
| 2017/0207784 A1* | 7/2017 | Das .................. H03K 19/00323 |

* cited by examiner

US 10,373,680 B2

CONTROLLING CURRENT THROUGH CORRELATED ELECTRON SWITCH ELEMENTS DURING PROGRAMMING OPERATIONS

BACKGROUND

Field

Subject matter disclosed herein relate to correlated electron switch elements and, more particularly, to controlling current through correlated electron switch elements during programming operations.

Information

Integrated circuit devices, such as electronic switching devices, for example, may be found in a wide range of electronic circuit types in a wide range of electronic devices. For example, memory, logic, analog, and/or other electronic circuit types may incorporate electronic switches that may be used in computers, digital cameras, cellular telephones, tablet devices, personal digital assistants, etc. Factors related to electronic switching devices, such as may be incorporated in memory, logic, analog, and/or other electronic circuit types, that may be of interest to a designer in considering suitability for any particular application may include physical size, storage density, operating voltages, impedance ranges and/or power consumption, for example. Other example factors that may be of interest to designers may include, for example, cost of manufacture, ease of manufacture, scalability, and/or reliability. Moreover, there appears to be an ever increasing need for memory, logic, analog, and/or other electronic circuit types that exhibit characteristics of lower power, lower cost, and/or greater performance.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1B:
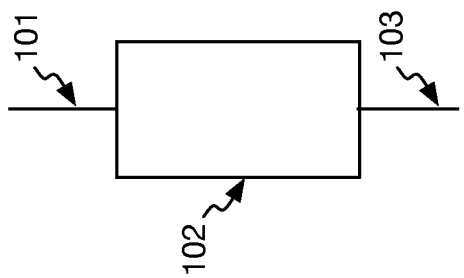
FIG. 1b depicts an illustration of an example symbol for a correlated electron switch device, in accordance with an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has always been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe example embodiments utilizing electron materials (CEMs) in correlated electron switch (CES) devices, for example, such as may be utilized to form a correlated electron random access memory (CERAM), such may include one or more CES elements, in memory and/or logic devices, and/or such as may be utilized in any number of other circuit and/or device types, for example. Correlated electron materials, which may be utilized in the construction of CES devices, for example, may also be utilized in a wide range of other electronic circuit types, such as, for example, memory controllers, memory arrays, processors, microcontrollers, filter circuits, data converters, optical instruments, phase locked loop circuits, microwave and millimeter wave transceivers, and so forth, although claimed subject matter is not limited in scope in these respects. In this context, a CES device may exhibit a substantially rapid conductor-to-insulator transition, which may be brought about by electron correlations rather than solid state structural phase changes, such as in response to a change from a crystalline to an amorphous state, for example, in a phase change memory device or, in another example, formation of filaments in conductive and resistive RAM devices. In one aspect, a substantially rapid conductor-to-insulator transition in a CES device may be responsive to a quantum mechanical phenomenon, in contrast to melting/solidification or filament formation, for example, in phase change and resistive RAM devices. Such quantum mechanical transitions between relatively conductive and relatively insulative states, and/or between first and second impedance states, for example, in a CEM may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/or may, at times, be referred to as a "relatively insulative/higher impedance state."

In an aspect, a quantum mechanical transition of a CEM between a relatively insulative/higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may switch from a relatively insulative/higher impedance state to a relatively conductive/lower impedance state if a Mott transition condition occurs. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of a CES device changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state.

In another aspect, the Mott transition may be controlled by a localization of electrons. If carriers, such as electrons, for example, are localized, a strong coulomb interaction between the carriers is believed to split the bands of a CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

Further, in an embodiment, transitioning from a relatively insulative/higher impedance state to a substantially dissimilar and relatively conductive/lower impedance state may bring about a change in capacitance in addition to a change in resistance. For example, a CEM may exhibit a variable resistance together with a property of variable capacitance. In other words, impedance characteristics of a CEM may include both resistive and capacitive components. For example, in a metal state, a CEM may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating a CEM and, therefore, a CEM may exhibit higher capacitance based, at least in part, on additional charges stored within a CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of a CEM comprising a device. In an embodiment, a CEM may form a "bulk switch." As used herein, the term "bulk switch" refers to at least a majority volume of a CEM switching a device's impedance state, such as in response to a Mott-transition. For example, in an embodiment, substantially all CEM of a device may switch from a relatively insulative/higher impedance state to a relatively conductive/lower impedance state or from a relatively conductive/lower impedance state to a relatively insulative/higher impedance state responsive to a Mott-transition. In an embodiment, a CEM may comprise one or more transition metals, one or more transition metal compounds, one or more transition metal oxides (TMOs), one or more oxides comprising rare earth elements, one or more oxides of one or more f-block elements of the periodic table, one or more rare earth transitional metal oxide perovskites, yttrium, and/or ytterbium, although claimed subject matter is not limited in scope in this respect. In an embodiment, a CEM may comprise one or more materials selected from a group comprising aluminum, cadmium, chromium, cobalt, copper, gold, iron, manganese, mercury, molybdenum, nickel, palladium, rhenium, ruthenium, silver, tin, titanium, vanadium, yttrium, and zinc (which may be linked to a cation, such as oxygen or other types of ligands), or combinations thereof, although claimed subject matter is not limited in scope in this respect.

Figure 1A:
FIG. 1a shows block diagram of an example embodiment of a correlated electron switch device comprising a correlated electron material, in accordance with an embodiment.

FIG. 1a shows an example embodiment 100 of a CES device comprising CEM, such as one or more materials 102, sandwiched between conductive terminals, such as conductive terminals 101 and 103. In an embodiment, a CES device, such as CES device 100, may comprise a variable impeder device. As utilized herein, the terms "correlated electron switch" and "variable impeder" may be interchangeable. At least in part through application of a critical voltage and a critical current between the terminals, such as between conductive terminals 101 and 103, a CEM, such as material 102, may transition between aforementioned relatively conductive/lower impedance states and relatively insulative/higher impedance states. As mentioned, a CEM, such as one or more materials 102, in a variable impeder device, such as CES device 100, may transition between a first impedance state and a second impedance state due to a quantum mechanical transition of the correlated electron switch material as a result an applied critical voltage and/or an applied critical current, as described in more detail below. Also, as mentioned above, a variable impeder device, such as CES device 100, may exhibit properties of both variable resistance and variable capacitance.

FIG. 1b depicts an example symbol 110 that may be utilized, for example, in electrical circuit schematic diagrams to notate a CES/variable impeder device. Example symbol 110 is meant to remind the viewer of the variable resistance and variable capacitance properties of a CES/variable impeder device, such as CES device 100. Example symbol 110 is not meant to represent an actual circuit diagram, but is merely meant as an electrical circuit diagram symbol. Of course, claimed subject matter is not limited in scope in these respects.

Figure 2:
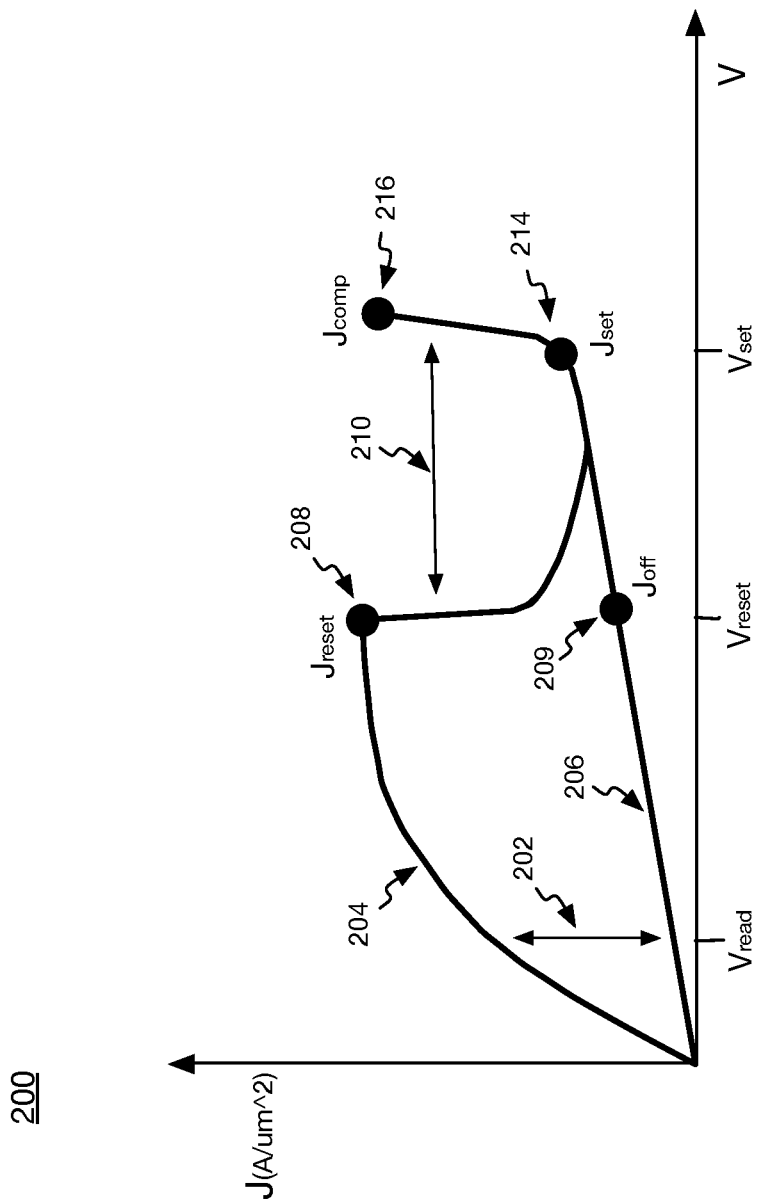
FIG. 2 shows an example plot of current density versus voltage for a correlated electron switch device, in according to an embodiment.

FIG. 2 is a diagram showing an example voltage versus current density profile of a device formed from a CEM according to an embodiment 200. Based, at least in part, on a voltage applied to terminals of a CES device, for example, during a "write operation," a CES device may be placed into a relatively lower impedance state or a relatively higher impedance state. For example, application of a voltage $V_{set}$ and a current density $J_{set}$ may place a CES device into a relatively lower-impedance state. Conversely, application of a voltage $V_{reset}$ and a current density $J_{reset}$ may place a CES device into a relatively higher impedance state. As shown in FIG. 2, reference designator 210 illustrates the voltage range that may separate $V_{set}$ from $V_{reset}$. Following placement of a CES device into a relatively higher impedance state or relatively lower impedance state, the particular state of a CES device may be detected by application of a voltage $V_{read}$ (e.g., during a read operation) and detection of a current or current density at terminals of a CES device.

According to an embodiment, a CES device of FIG. 2 may include any transition metal oxide (TMO), such as, for example, perovskites, Mott insulators, charge exchange insulators, and Anderson disorder insulators. In particular implementations, a CES device may be formed from switching materials, such as nickel oxide, cobalt oxide, iron oxide, yttrium oxide, and perovskites, such as chromium doped strontium titanate, lanthanum titanate, and the manganate family including praseodymium calcium manganate, and praseodymium lanthanum manganite, just to provide a few examples. In particular, oxides incorporating elements with incomplete "d" and "f" orbital shells may exhibit sufficient impedance switching properties for use in a CES device. Other implementations may employ other transition metal compounds without deviating from claimed subject matter.

In one aspect, a CES device of FIG. 2 may comprise materials of the general form $AB:L_x$ (such as NiO:CO) where AB represents a transition metal, transition metal compound, or transition metal oxide variable impedance material and $L_x$ represents a dopant ligand; though it should be understood that these are exemplary only and are not intended to limit claimed subject matter. Particular implementations may employ other variable impedance materials as well. Nickel oxide, NiO, is disclosed as one particular TMO. NiO materials discussed herein may be doped with extrinsic ligands, $L_x$ which may establish and/or stabilize variable impedance properties. In particular, NiO variable impedance materials disclosed herein may include a carbon-containing ligand such as carbonyl (CO), forming NiO:CO. In another particular example, NiO doped with extrinsic ligands may be expressed as $NiO:L_x$, where $L_x$ is a ligand element or compound and x indicates a number of units of the ligand for one unit of NiO. One skilled in the art may determine a value of x for any specific ligand and any specific combination of ligand with NiO or any other transition metal compound simply by balancing valences. In particular, NiO variable impedance materials disclosed herein may include carbon containing molecules of the form $C_aH_bN_dOf$ (in which a≥1, and b, d and f≥0) such as: carbonyl (CO), cyano (CN$^-$), ethylene diamine ($C_2H_8N_2$), phen(1,10-phenanthroline) ($C_{12}H_8N_2$), bipyridine ($C_{10}H_8N_2$), ethylenediamine (($C_2H_4(NH_2)_2$), pyridine ($C_5H_5N$), acetonitrile ($CH_3CN$), and cyanosulfanides such as thiocyanate (NCS$^-$), for example.

In accordance with FIG. 2, if sufficient bias is applied (e.g., exceeding a band-splitting potential) and the aforementioned Mott condition is satisfied (e.g., injected electron holes are of a population comparable to a population of electrons in a switching region, for example), a CES device may switch from a relatively lower impedance state to a substantially dissimilar impedance state, such as a relatively higher impedance state, responsive to a Mott transition. This may correspond to point 208 of the voltage versus current density profile of FIG. 2. At, or suitably nearby this point, electrons are no longer screened and become localized. This correlation may result in a strong electron-electron interaction potential which may operate to split the bands to form a relatively higher-impedance material. If a CES device comprises a relatively higher impedance state, current may generated by transportation of electron holes. Consequently, if a threshold voltage is applied across terminals of a CES device, electrons may be injected into a metal-insulator-metal (MIM) diode over the potential barrier of the MIM device. If a threshold current of electrons is injected and a threshold potential is applied across terminals to place a CES device into a "set" state, an increase in electrons may screen electrons and remove a localization of electrons, which may operate to collapse the band-splitting potential, thereby bringing about a relatively lower impedance state.

According to an embodiment, current in a CES device may be controlled by an externally applied "compliance" condition, which may be determined at least partially on the basis of an applied external current, which may be limited during a write operation, for example, to place a CES device into a relatively higher-impedance state. This externally-applied compliance current may, in some embodiments, also set a condition of a current density for a subsequent reset operation to place a CES device into a relatively higher impedance state. As shown in the particular implementation of FIG. 2, a current density $J_{comp}$ may be applied during a write operation at point 116 to place a CES device into a relatively higher impedance state, may determine a compliance condition for placing a CES device into a relatively lower impedance state in a subsequent write operation. As shown in FIG. 2, a CES device may be subsequently placed into a relatively lower impedance state by application of a current density $J_{reset} \geq J_{comp}$ at a voltage $V_{reset}$ at point 208, at which $J_{comp}$ is externally applied.

In embodiments, compliance may set a number of electrons in a CES device which may be "captured" by holes for the Mott transition. In other words, a current applied in a write operation to place a CES device into a relatively lower impedance state may determine a number of holes to be injected to a CES device for subsequently transitioning a CES device to a relatively higher impedance state.

As pointed out above, a reset condition may occur in response to a Mott transition at point 208. As pointed out above, such a Mott transition may bring about a condition in a CES device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \qquad (1)$$

$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 204 of the voltage versus current density profile shown in FIG. 2, may exist in response to injection of holes from a voltage signal applied across terminals of a CES device. Here, injection of holes may meet a Mott transition criterion for the relatively lower impedance state to relatively higher impedance state transition at current $I_{MI}$ as a threshold voltage $V_{MI}$ is applied across terminals of a CES device. This may be modeled according to expression (2) as follows:

$$I_{MI}(V_{MI}) = \frac{dQ(V_{MI})}{dt} \approx \frac{Q(V_{MI})}{t} \qquad (2)$$

$$Q(V_{MI}) = qn(V_{MI})$$

Where $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$

$$J_{reset}(V_{MI}) = J_{MI}(V_{MI}) = \frac{I_{MI}(V_{MI})}{A_{CEM}} = \frac{q}{A_{CEM} t}\left(\frac{C}{\lambda_{TF}(V_{MI})}\right)^3$$

Figure 3:
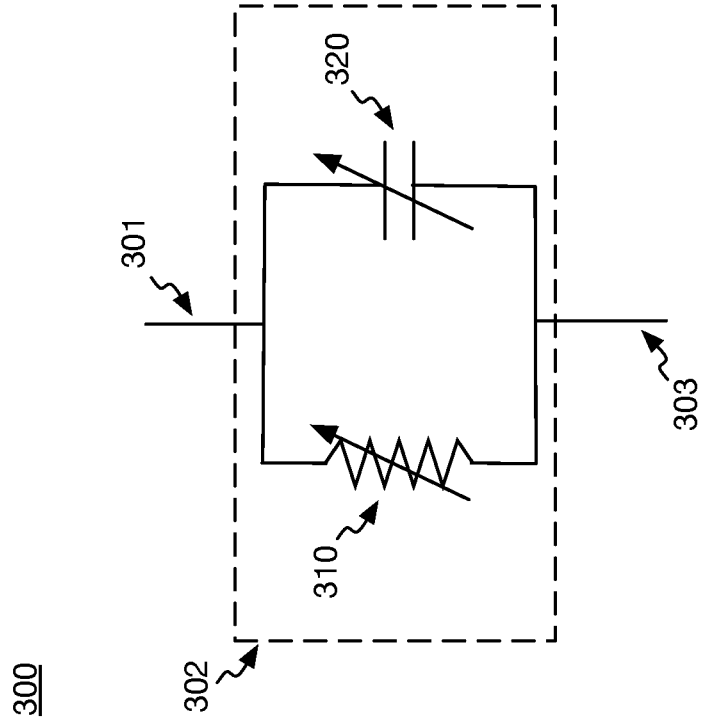
FIG. 3 is a schematic diagram of an equivalent circuit of a correlated electron switch, in accordance with an embodiment.

In which $A_{CEM}$ is a cross-sectional area of a CEM of a CES device; and $J_{reset}(V_{MI})$ may represent a current density through a CES device to be applied to a CES device at a threshold voltage $V_{MI}$, which may place a CEM device in a relatively higher impedance state FIG. 3 depicts a schematic diagram of an equivalent circuit of an example CES device according to an embodiment 300. As previously mentioned, a correlated electron switch (CES) device, a CES element, a CERAM array, and/or other type of device utilizing one or more correlated electron materials may comprise variable or complex impedance device that may exhibit characteristics of both variable resistance and variable capacitance. In other words, impedance characteristics for a CEM variable impedance device, such as a CES device according to embodiment 300, may depend at least in part on resistance and capacitance characteristics of the device if measured across device terminals 301 and 302, for example. In an embodiment, an equivalent circuit for a variable impedance device may comprise a variable resistor, such as variable resistor 310, in parallel with a variable capacitor, such as variable capacitor 320. Of course, although a variable resistor 310 and variable capacitor 320 are depicted in FIG. 3 as comprising discrete components, a variable impedance device, such as device of embodiment 300, may comprise a substantially homogenous CEM and claimed subject matter is not limited in this respect.

Table 1 below depicts an example truth table for an example variable impedance device, such as the CES device of embodiment 300.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})\sim 0$ | $Z_{low}(V_{applied})$ |

In an embodiment, Table 1 shows that a resistance of a variable impedance device, such as the CES device of embodiment 300, may transition between a relatively lower impedance state and a substantially dissimilar relatively higher impedance state as a function at least partially dependent on a voltage applied across a CES device. In an embodiment, an impedance exhibited at a relatively lower impedance state may be approximately in the range of 10.0-100,000.0 times lower than a substantially dissimilar impedance exhibited in a relatively higher impedance state. In other embodiments, an impedance exhibited at a relatively lower impedance state may be approximately in the range of 5.0 to 10.0 times lower than an impedance exhibited in a relatively higher impedance state, for example. It should be noted, however, that claimed subject matter is not limited to any particular impedance ratios between relatively higher impedance states and relatively lower impedance states. Truth Table 1 shows that a capacitance of a variable impedance device, such as the CES device of embodiment 300, may transition between a relatively lower capacitance state, which, in an example embodiment, may comprise approximately zero, or very little, capacitance, and a relatively higher capacitance state that is a function, at least in part, of a voltage applied across a CES device.

According to an embodiment, a CES device, which may be utilized to form a CES element, such as may be utilized in a memory device, for example, and/or a variety of other electronic devices comprising one or more correlated electron materials, may be placed into a relatively lower impedance state, such as by transitioning from a relatively higher impedance state, for example, via injection of a sufficient quantity of electrons to satisfy a Mott transition criteria. In transitioning a CES device to a relatively lower impedance state, if enough electrons are injected and the potential across the terminals of a CES device overcomes a threshold switching potential (e.g., $V_{set}$), injected electrons may begin to screen. As previously mentioned, screening may operate to un-localize double-occupied electrons to collapse the band-splitting potential, thereby bringing about a relatively lower impedance state.

In an embodiment, it may be desirable and/or advantageous to incorporate correlated electron switch (CES) devices in CES elements, such as within a memory array, for example. In an embodiment, different impedance states that may be achieved within CES elements to represent different logical values and/or parameters. For example, a CES element, such as may comprise a CES device and an access device in an embodiment, programmed to a relatively lower impedance state may represent a binary "1" value, and/or a CES element programmed to a relatively higher impedance state may represent a binary "0" value, in an embodiment, although claimed subject matter is not limited in scope in this respect. Further, in an embodiment, to sense an impedance state of a CES element, sensing circuitry may generate an output signal indicative of a particular impedance state of the CES element at least in part by detecting a rate at which a precharged bit-line is discharged through one or more CES elements, for example.

Figure 4:
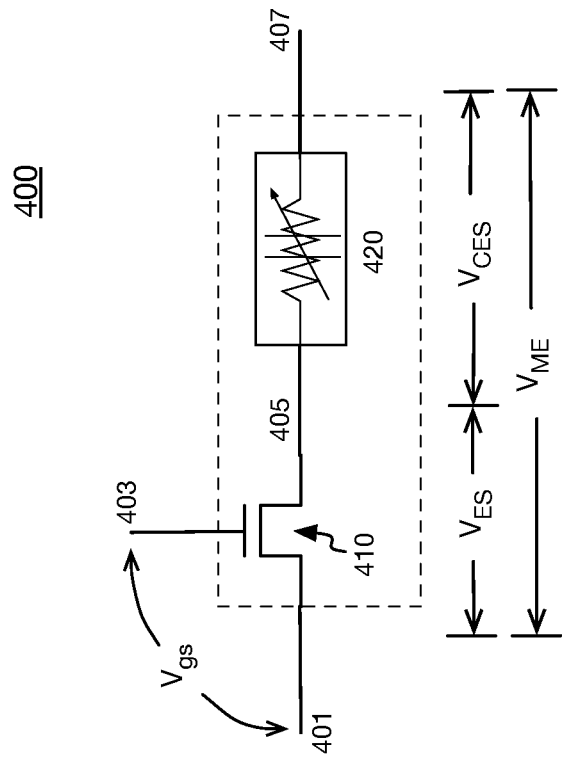
FIG. 4 depicts a schematic block diagram of an example correlated electron switch element, in accordance with an embodiment.

FIG. 4 depicts a schematic block diagram of an embodiment 400 of an example CES element. In an embodiment, a CES element, such as CES element 400, may comprise one or more access devices, such as access device 410, and/or one or more CES devices, such as CES device 420. As utilized herein, "CES element" refers to a circuit or portion of a circuit, including one or more CES devices, capable of representing a value, symbol, or parameter as a state. For example, a CES element may comprise one or more CES devices capable of representing a value, symbol, or parameter as one or more impedance states of the one or more CES devices. In particular embodiments, a CES element may represent a value, symbol, or parameter as a single bit or multiple bits.

In an embodiment, an access device, such as access device 410, may comprise an electronic switch. As utilized herein, "electronic switch" refers to a circuit or portion of a circuit capable of electrical conduction in response to a condition. For example, an electronic switch may comprise a three-terminal device, wherein conduction may occur between two terminals of the electronic switch at least in part in response to a voltage and/or current level between one of the two terminals and a third terminal exceeding a threshold voltage and/or current level, such as explained more fully below in connection with example electronic switch 410. Further, in an embodiment, an electronic switch, such as 410, may comprise an NMOS transistor, although claimed subject matter is not limited in this respect.

In an embodiment, a CES element, such as CES element 400, may be programmed to a particular approximate impedance state among two or more approximate impedance states. For example, as mentioned above, a CES element, such as CES element 400, may be programmed to either a relatively lower impedance state via a set operation and/or to a relatively higher impedance state via a reset operation. For example, write operations may transition a CES device to a relatively lower impedance state ("set") or to a relatively higher impedance state ("reset"). In an embodiment, a CES device, such as CES device 420 of element 400, for example, may initially be programmed and/or initiated to a relatively lower impedance state. Through application of an appropriate voltage ($V_{ME}$) across a CES element, such as element 400, and/or through application of an appropriate current through a CES element, such as element 400, a reset condition may be achieved, and a CES element, such as element 400, may be programmed via a write operation to a relatively higher impedance state.

In an embodiment, to perform a write operation on a CES element, such as CES element 400, to transition the CES element to a relatively lower impedance state, a set voltage, such as approximately 1.2V, may be applied across the element. For example, a set voltage of approximately 1.2V may be applied across nodes 401 and 407 of CES element 400. An electronic switch, such as NMOS transistor 410, may at least in part control an amount of current flowing through a CES element, such as 400. In an embodiment, a voltage signal ($V_{gs}$) may be applied to a terminal of an electronic switch, such as to a gate terminal 403 of NMOS transistor 410, to at least partially control current flow through the electronic switch. For example, by varying a voltage across gate terminal 403 and terminal 401, current flow through electronic switch 410, and therefore current flow through CES device 420, may be varied, as explained more fully below.

As discussed above, to achieve a reset condition for a CES device, such as CES device 420, current flow through the CES device may be greater than a compliance current applied to the CES device during a previous set operation. Thus, in an embodiment, conditions to be achieved to reset a CES device, such as CES device 420, such as to transition the CES device from a relatively lower impedance state to a relatively higher impedance state, may depend, at least in part, on an amount of current to have flowed through the CES device during a previous write operation to transition the CES device to a relatively lower impedance state. As discussed above, a compliance current during a set operation for a CES device, such as CES device 420, may be remembered, in a sense, by a CES device. Further, to perform a successful set operation for a CES device, such as CES device 420, to transition the CES device to a relatively higher impedance state, an amount of current through the CES device during the write operation to transition the CES device to a relatively higher impedance state may exceed current flow through the CES device during a previous write operation to transition the CES device to a relatively lower impedance state.

In an embodiment, at least in part to enable successful write operations to place a CES element in a relatively higher impedance state, a voltage $V_{ME}$ across the CES element may be increased at least in part to cause an increase in current through the CES element. Further, in an embodiment, at least in part to enable successful write operations to place a CES element in a relatively higher impedance state, a voltage $V_{ME}$ across the CES element may be kept lower than a set voltage to avoid spurious set conditions, as explained more fully below. Additionally, in an embodiment, at least in part to enable successful write operations to transition a CES element to a relatively higher impedance state, a voltage $V_{gs}$, such as across terminals 403 and 401 of electronic switch 410, may be increased at least in part to increase current flow through the CES element. In an embodiment a voltage $V_{gs}$ may be increased at least in part to increase current flow through a CES element without increasing a voltage $V_{ME}$ across the CES element. Further, as discussed more fully below, a compliance current through a CES device, such as CES device 420 of CES element 400, during set operations may be controlled at least in part to enable successful reset operations, in an embodiment.

Figure 5:
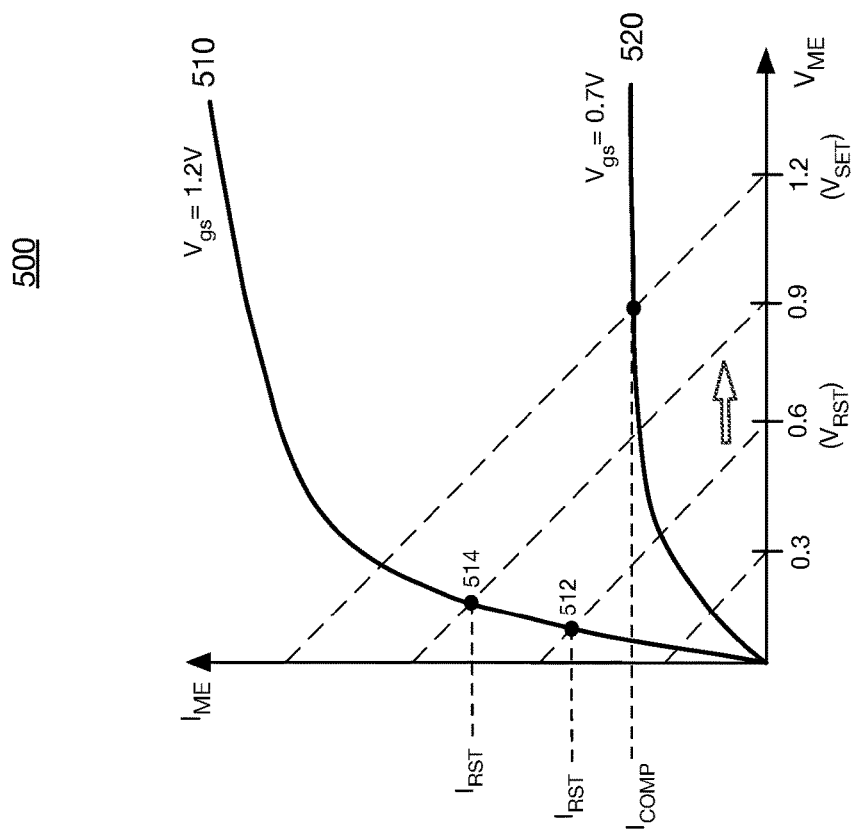
FIG. 5 shows an example plot of current versus voltage for an example correlated electron switch element programming operation, in accordance with an embodiment.

FIG. 5 shows an example plot 500 of an example current ($I_{ME}$) through a CES element, such as CES element 400, versus an example voltage ($V_{ME}$) across a CES element, such as element 400, for one or more example programming operations, in accordance with an embodiment. In an embodiment, an example plot line, such as 510, may depict an example plot line for an example reset operation. For example, plot line 510 may depict an example plot line for an example write operation to place CES element 400 in a relatively higher impedance state. Further, in an embodiment, an example plot line, such as 520, may depict an example plot line for an example set operation. For example, plot line 520 may depict an example plot line for an example write operation to place CES element 400 in a relatively lower impedance state. In an embodiment, a compliance current ($I_{COMP}$) for an example write operation to place a CES element, such as CES element 400, in a relatively lower impedance state (e.g., plot line 520 for set operation) may be controlled at least in part by limiting a voltage signal $V_{gs}$ applied to a CES element access device, such as electronic switch 410, during the write operation to approximately 0.7V, for example.

In an embodiment, as depicted in example plot 500, a voltage $V_{ME}$ across a CES element, such as CES element 400, during a write operation to place the CES element in a relatively higher impedance state (e.g., reset) may be increased, such as from 0.6V to 0.9V, for example, at least in part to enable a successful write (e.g., reset) operation, for example. In an embodiment, by increasing $V_{ME}$, such as from 0.6V to 0.9V, during a write operation to transition a CES element to a relatively higher impedance state, a current ($I_{RST}$) through a CES element, such as CES element 400, during the write (e.g., reset) operation may increase from a first level 512 to a second level 514, thereby providing increased margin between a compliance current ($I_{COMP}$) for a write operation to place the CES device in a relatively lower impedance state (e.g., set operation) and a current ($I_{RST}$) for a write operation to place the CES element in a relatively higher impedance state (e.g., reset operation). In an embodiment, an increased margin between $I_{COMP}$ and $I_{RST}$ may at least in part enable reliable and/or successful write operations to place a CES element in a relatively higher impedance state (e.g., reset operation). Of course, a voltage $V_{ME}$ across a CES element, such as CES element 400, may be limited in an embodiment to a level below a set voltage to avoid spurious set conditions. For example, $V_{ME}$ may be limited to a level less than 1.2V, in an embodiment. As depicted in example plot 500, $V_{ME}$ may be limited to a level of approximately 0.9V, for example, to provide an example margin of approximately 0.3V between $V_{RST}$ and $V_{SET}$. Of course, claimed subject matter is not limited in scope to the example voltage levels described herein.

Figure 6:
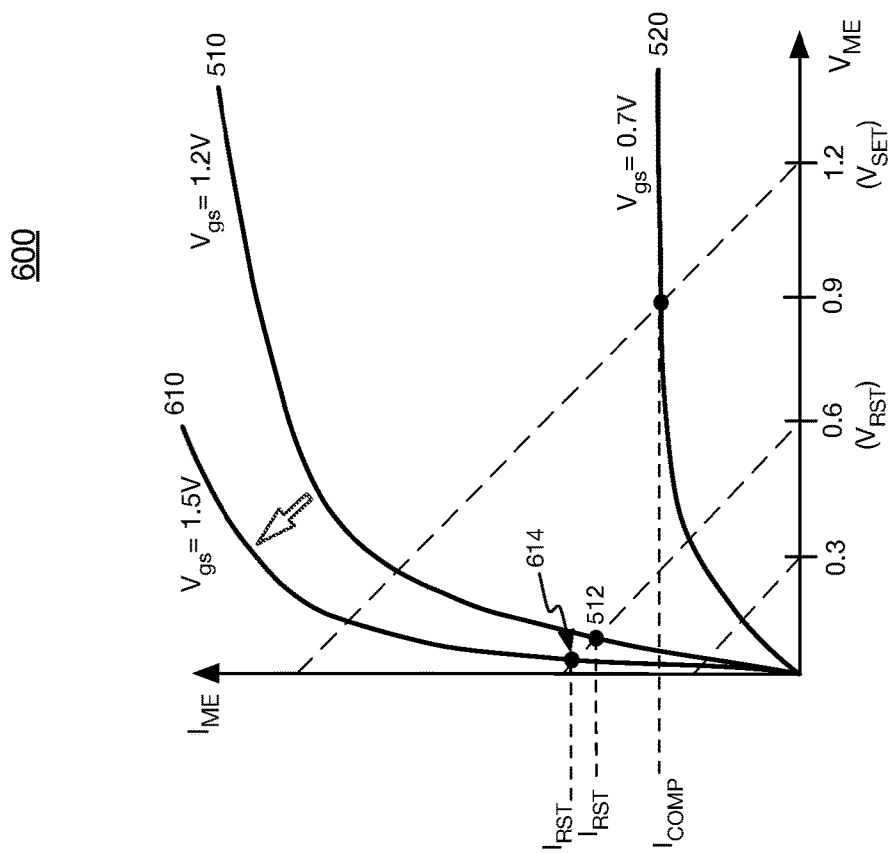
FIG. 6 depicts an example plot of current versus voltage for an example correlated electron switch element programming operation, in accordance with an embodiment.

FIG. 6 depicts an example plot 600 of an example current ($I_{ME}$) through a CES element, such as CES element 400, versus an example voltage ($V_{ME}$) across a CES element, such as element 400, for one or more example write operations, in accordance with an embodiment. In an embodiment, an example plot line, such as 510, may depict an example plot line for an example write operation to place a CES element in a relatively higher impedance state (e.g., reset operation). Further, in an embodiment, an example plot line, such as 520, may depict an example plot line for an example write operation to place a CES element in a relatively lower impedance state (e.g., set operation).

In an embodiment, as depicted in example plot 600, a voltage $V_{gs}$ applied to an access device, such as across terminals 401 and 403 of electronic switch 410, during a write operation to place a CES element in a relatively higher impedance state (e.g., reset operation) may be increased, such as from 1.2V to 1.5V, for example, at least in part to enable successful reset operations for the CES element, for example. For example, by increasing $V_{gs}$, such as from 1.2V to 1.5V, during a write operation to place a CES device in a relatively higher impedance state (e.g., reset operation), a current ($I_{RST}$) through a CES element, such as CES element 400, during the write (e.g., reset) operation may increase from a first level 512 to a second level 614 depicted on example plot 610, thereby providing increased margin between a compliance current ($I_{COMP}$) for a set operation and a current ($I_R$ST) for a reset operation. As mentioned, in an embodiment, an increased margin between $I_{COMP}$ and $I_{RST}$ may enable reliable and/or successful reset operations.

As described herein, embodiments may at least in part ensure successful and/or reliable write operations to place a CES element in a relatively higher impedance state (e.g., reset operation) by increasing a reset programming voltage, by increasing a voltage applied to an access device, or by restricting an amount of current flowing through a CES element during a write operation to place a CES element in a relatively lower impedance state (e.g., set operation), or any combination thereof. As discussed above, a programming voltage for a set operation (e.g., write operation to place a CES element in a relatively lower impedance state) may exceed that for a reset operation (e.g., write operation to place a CES element in a relatively higher impedance state). Further, as discussed above, a programming current for a reset operation (e.g., write operation to place a CES element in a relatively higher impedance state) may meet or exceed a level of current for a previous set operation (e.g., write operation to place a CES element in a relatively lower impedance state). In an embodiment, an amount of current that may flow through a CES element, such as CES element 400, during a reset operation (e.g., write operation to place a CES element in a relatively higher impedance state) may be limited at least in part by supply voltage levels or by access device and/or CES device characteristics, or a combination thereof, for example. Therefore, one or more embodiments may combine adjustments in levels of current during reset operations (e.g., write operations to place a CES element in a relatively higher impedance state) and/or adjustments to levels of current during set operations (e.g., write operations to place a CES element in a relatively lower impedance state), for example utilizing one or more techniques described herein, to at least in part enable successful and/or reliable reset operations (e.g., write operations to place a CES element in a relatively higher impedance state).

Figure 7:
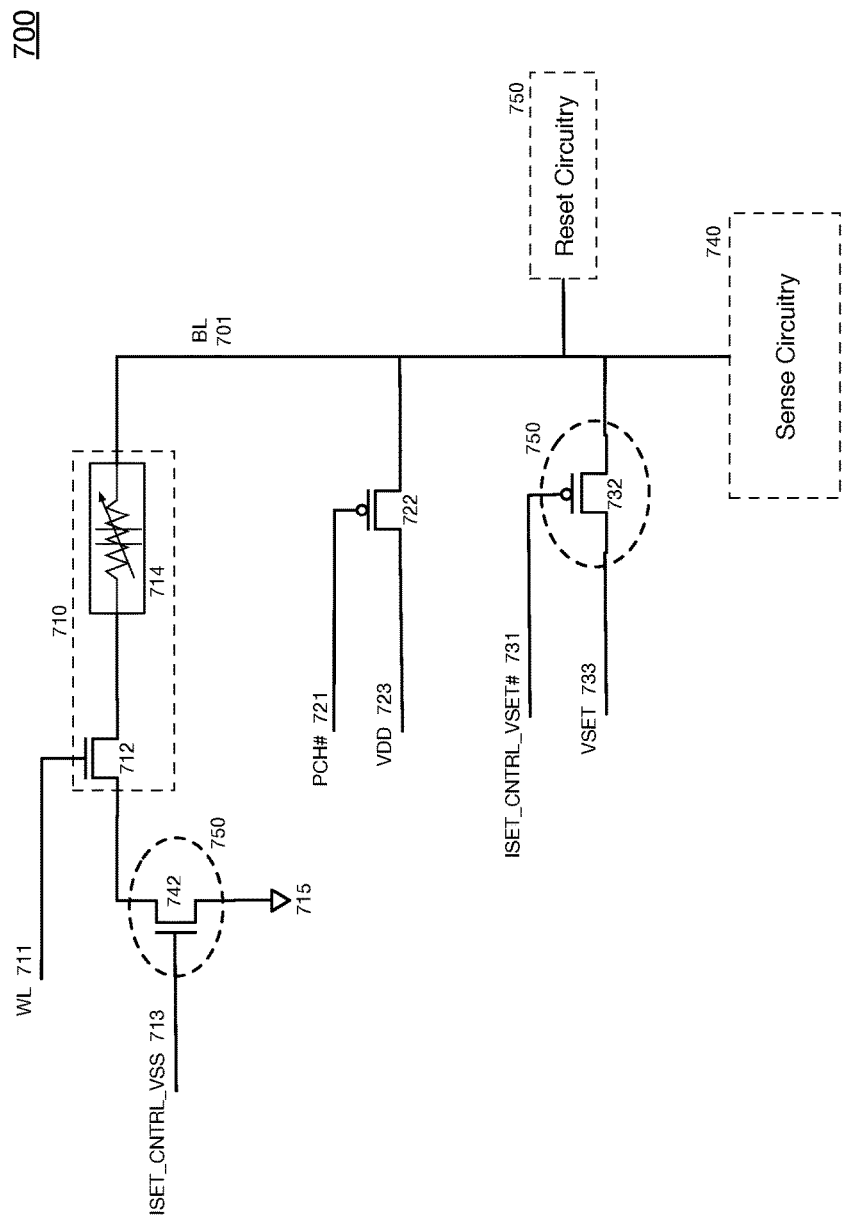
FIG. 7 depicts a schematic block diagram of an example circuit for programming one or more correlated electron switch elements, in accordance with an embodiment.

FIG. 7 depicts a schematic block diagram of an embodiment 700 of an example circuit for programming one or more CES elements, such as CES element 710, in accordance with an embodiment. In an embodiment, a CES element, such as CES element 710, may comprise one or more access devices, such as access device 712, and/or one or more CES devices, such as CES device 714. In an embodiment, an access device, such as access device 712, may comprise an electronic switch. For example, electronic switch 712 may comprise one or more NMOS transistors, although claimed subject matter is not limited in scope in this respect.

In an embodiment, a CES element, such as CES element 710, may be programmed to a particular approximate impedance state among two or more approximate impedance states. For example, a CES element, such as CES element 710, may be programmed to either a relatively lower impedance state via a set operation and/or to a relatively higher impedance state via a reset operation at least in part through application of an appropriate voltage ($V_{ME}$) across the CES element and/or through appropriate control of a current through the CES element. In an embodiment, reset circuitry, such as 750, may, at least in part, perform reset operations for one or more CES elements, such as CES element 710. Example circuitry for performing a set operation is discussed more fully below.

As used herein, "word-line" refers to a conductor, such as an electrically conductive line of an integrated circuit device, that may be utilized to select one or more CES elements for write and/or read operations. For example, by asserting, at least in part, a signal, such as WL 711, to at least partially enable an access device, such as electronic switch 712, at least some current may flow through a CES device, such as CES device 714, such as during read and/or write operations, in an embodiment.

Although example embodiments, such as 700, depict and/or describe single CES elements, claimed subject matter is not limited in scope in this respect. For example, embodiments in accordance with claimed subject matter may include larger amounts of CES elements. In an embodiment, sense circuitry, such as sense circuitry 740, may comprise an amplifier, invertor, or other circuitry, or a combination thereof, to sense an impedance state of a CES element, such as CES element 710. Also, in an embodiment, a bit-line, such as BL 701, may electrically couple sense circuitry, such as 740, to one or more CES elements, such as CES element 710. In an embodiment, "sense circuitry" and/or the like represent electronic circuitry that may assert a signal, such as a sense amplifier output signal, at least in part in response to a changing voltage and/or current level on a signal, such as bit-line 701.

As utilized herein, the terms "assert" and/or "asserted" and/or the like in the context of a high-enabled signal refer to a logically high voltage level (e.g., binary "1") and "non-asserted" and/or "de-asserted" and/or the like refer to a logically low voltage level (e.g., binary "0"). Similarly, "assert" and/or "asserted" and/or the like in the context of a low-enabled signal refer to a logically low voltage level, and "non-asserted" and/or "de-asserted" and/or the like refer to a logically high voltage level. As utilized herein, low-enabled signals may be identified by a character "#" in connection with a signal name. Further, signals in accordance with claimed subject matter may be high-enabled and/or low-enabled. Although various example signals described herein may be identified as either low-enabled or high-enabled, the scope of claimed subject matter is not limited in these respects. For example, although one or more example signals described herein may be identified as low-enabled signals, other embodiments may identify one or more of the example signals as high-enabled signals. Similarly, although one or more example signals described herein may be identified as high-enabled signals, other embodiments may identify one or more of the example signals as low-enabled signals. Further, as noted above, at least some signals may be partially enabled and/or asserted, in an embodiment, such as to control current flow through a circuit element, for example.

As discussed above, for a programming/write operation, to achieve a reset condition (e.g., place a CES element in a relatively higher impedance state) for a CES element, such as CES element 710, current flow through the CES element may be greater than a compliance current applied to the CES element during a previous set operation (e.g., write operation to place a CES element in a relatively lower impedance state). Thus, in an embodiment, conditions to be achieved to reset a CES device, such as CES device 714, such as to transition the CES device from a relatively lower impedance state to a relatively higher impedance state, may depend, at least in part, on an amount of current to flow through the CES device during a previous set operation.

In an embodiment, a compliance current through a CES device, such as CES device 714 of CES element 710, during set operations (e.g., write operations to place a CES device in a relatively lower impedance state) may be controlled at least in part to enable successful and/or reliable reset operations (e.g., write operations to place a CES device in a relatively higher impedance state). In an embodiment, to perform a set operation on a CES element, such as CES element 710, a set voltage, such as approximately 1.2V, may be applied across the CES element. For example, a set voltage of approximately 1.2V may be applied across CES element 710 at least in part by electrically coupling a set voltage signal (VSET), such as 733, to a bit-line, such as BL 701, at least in part in response to at least a partial assertion of a signal, such as ISET_CNTRL_VSET#731 applied to an electronic switch, such as PMOS 732. For example, a voltage level for ISET_CNTRL_VSET#731 may be varied to adjust an amount of current allowed to flow through PMOS transistor 732. Further, in an embodiment, an electronic switch, such as NMOS transistor 742, may control an amount of current flowing through a CES element, such as CES element 710, to a ground reference connection, such as 715, at least in part in response to an at least partial assertion of a signal, such as ISET_CNTRL_VSS 713. For example, a voltage level for ISET_CNTRL_VSS 713 may be varied to adjust an amount of current flow through NMOS transistor 734. Also, in an embodiment, a voltage signal, such as $V_{gs}$, may be applied via a word-line, such as WL 711, to a terminal of an electronic switch, such as NMOS transistor 712, to at least partially control current flow through a CES element, such as CES element 710.

In an embodiment, control of a compliance current ($I_{COMP}$) through one or more CES elements, such as CES element 710, by way of one or more write driver circuits, such as electronic switch 732, for example, and/or by way of one or more circuits to control electrical conductivity to a ground reference, such as electronic switch 742, for a set operation (e.g., write operation to place a CES device in a relatively lower impedance state) may be referred to as "global" current throttling. That is, "global" in this context refers to controlling current during a set operation at least in part through the use of one or more write driver circuits to control compliance current and/or one or more circuits to control access to a ground reference voltage. For example embodiment 700, global set operation current throttling circuitry, such as 750, may include, for example, one or more write driver circuits, such as electronic switch 732 or electronic switch 742, or a combination thereof. Of course, other embodiments in accordance with claimed subject matter may include other configurations and/or arrangements of circuitry for controlling current through a CES device during set operations, and the scope of claimed subject matter is not limited in these respects.

In an embodiment, to perform a read operation, a bit-line, such as BL 701, may be precharged during a precharge period by way of an electronic switch, such as PMOS transistor 722. For example, a precharge signal, such as PCH#721, may enable an electronic switch, such as PMOS transistor 722, when asserted during a precharge period. At least in part in response to an assertion of a precharge signal, such as PCH#721, a supply voltage, such as VDD 723, may be applied to a bit-line and/or node, such as BL 701. In an embodiment, a supply voltage, such as VDD 723, may comprise voltage level of approximately 1.2V, for example. Therefore, during a precharge period, a voltage level of approximately 1.2V may be applied to a bit-line, such as BL 701. In an embodiment, a read operation may comprise a precharge period and a sensing period. For example, for a read operation, a bit-line, such as BL 701, may be precharged via PMOS transistor 722 and VDD 723. Also, in an embodiment, at least in part in response to a de-assertion of PCH#721, and at least in part in response to an assertion of a word-line, such as WL 711, a bit-line, such as BL 701 may begin to discharge. Sense circuitry, such as sense circuitry 740, may detect an impedance state of one or more CES elements, such as CES element 710, at least in part in response to a bit-line, such as BL 701, discharging, in an embodiment.

Figure 8:
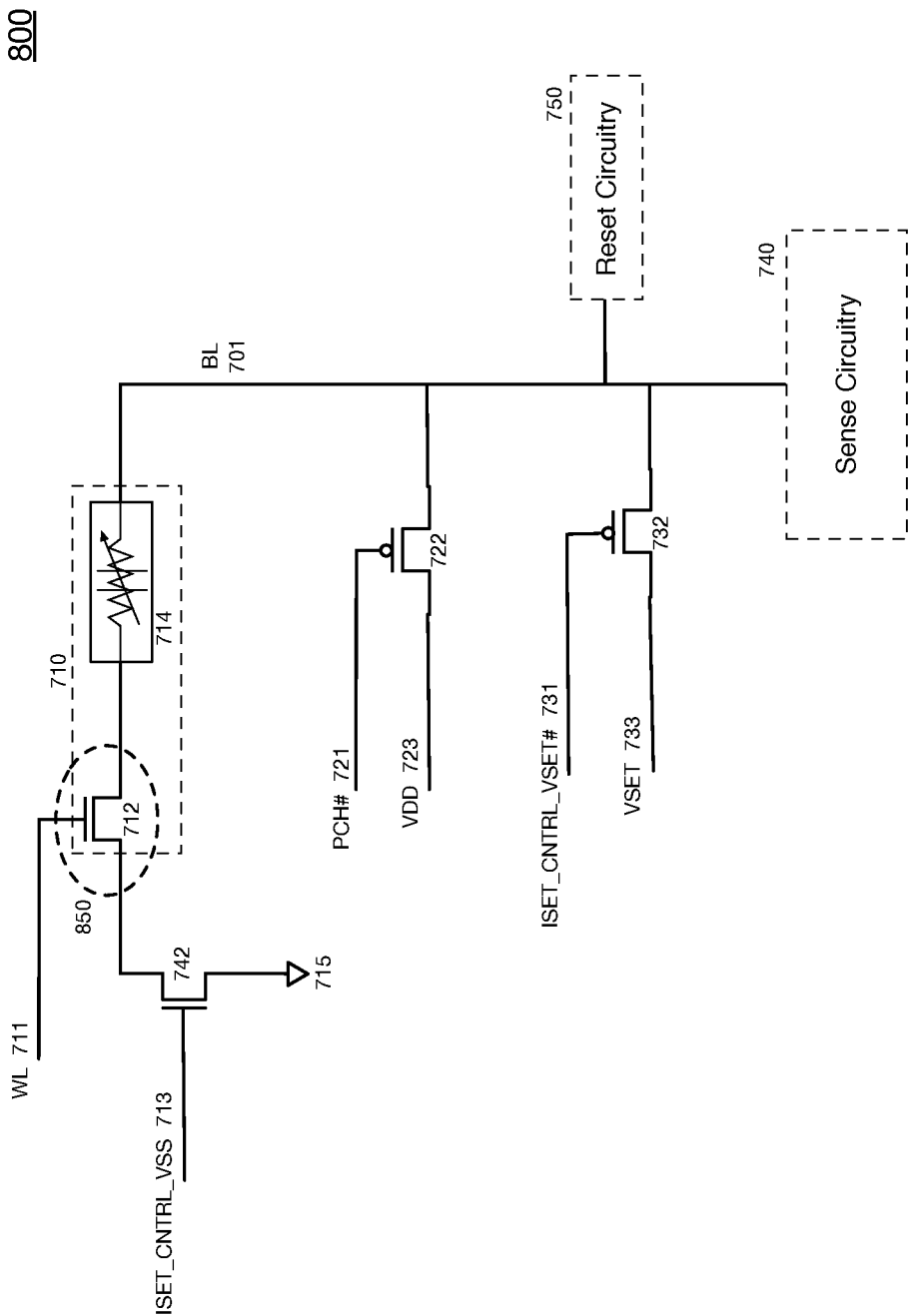
FIG. 8 depicts a schematic block diagram of an example circuit for programming one or more correlated electron switch elements, in accordance with an embodiment.

FIG. 8 depicts a schematic block diagram of an embodiment 800 of an example circuit for programming one or more CES elements, such as CES element 710, in accordance with an embodiment. In an embodiment, example circuit 800 may include at least some elements that may be similar to those discussed above in connection with example embodiment 700, although claimed subject matter is not limited in scope in this respect.

As discussed above, conditions to be achieved to reset a CES device, such as CES device 714, such as to transition the CES device from a relatively lower impedance state to a relatively higher impedance state, may depend, at least in part, on an amount of current to flow through the CES device during a previous set operation (e.g., write operation to place a CES device in a relatively lower impedance state). In an embodiment, a compliance current through a CES device, such as CES device 714 of CES element 710, during set operations may be controlled at least in part to enable successful and/or reliable reset operations (e.g., write operations to place a CES device in a relatively higher impedance state). In an embodiment, to perform a set operation on a CES element, such as CES element 710, a set voltage, such as approximately 1.2V, may be applied across the CES element. As discussed above, current through a CES element during a set operation may be controlled globally, in an embodiment. In other embodiments, however, current control during set operations may occur locally. For example, in an embodiment, a voltage signal, such as $V_{gs}$, may be applied via a word-line, such as WL 711, to a terminal of an electronic switch, such as NMOS transistor 712, to at least partially control current flow through a CES element, such as CES element 710. In an embodiment, a voltage signal, such as $V_{gs}$ that may be applied via a word-line, such as WL 711, may be supplied via a voltage supply capable of generating and/or providing a relatively intermediate voltage level, such as approximately 0.7V, for example.

As used herein, "local" throttling of current for a set operation (e.g., write operation to place a CES device in a relatively lower impedance state) refers to controlling conductivity of one or more access devices, such as electronic switch 712, of one or more CES elements, such as CES element 710. In an embodiment, a voltage level applied to a word-line, such as WL 711, may control conductivity of one or more access devices, such as electronic switch 712. By varying a voltage level on a word-line, such as WL 711, conductivity of one or more access devices, such as electronic switch 712, may be adjusted, for example.

In an embodiment, global throttling of current during set operations (e.g., write operations to place a CES element in a relatively lower impedance state) may allow programming of one or more CES elements in a single operation. Further, global throttling may be achieved, for example, using existing write driver signals and/or voltage supplies, in an embodiment, thereby utilizing relatively low overhead. Local throttling, on the other hand, may permit control of current for individual and/or particular CES elements, thereby accounting for individual variations of set behavior for individual CES elements, in an embodiment.

Although various embodiments are described herein comprising various configurations of devices and/or components and/or comprising various voltage levels for various signals, claimed subject matter is not limited in scope to the particular examples provided herein. Further, the examples described herein may comprise simplified examples, and the scope of claimed subject matter may include other embodiments comprising different types, amounts, and/or configurations of devices and/or components. Further, although embodiments described herein may include a single device and/or component for a particular function, embodiments in accordance with claimed subject matter may include multiple devices and/or components for the particular function. For example, an electronic switch, such as electronic switch 742, may be implemented with a single NMOS transistor in an embodiment. However, other embodiments may implement an electronic switch, such as 742, using multiple electronic switches, such as multiple transistors, for example. The embodiments discussed herein are merely examples, and claimed subject matter is not limited in scope in these respects.

Figure 9:
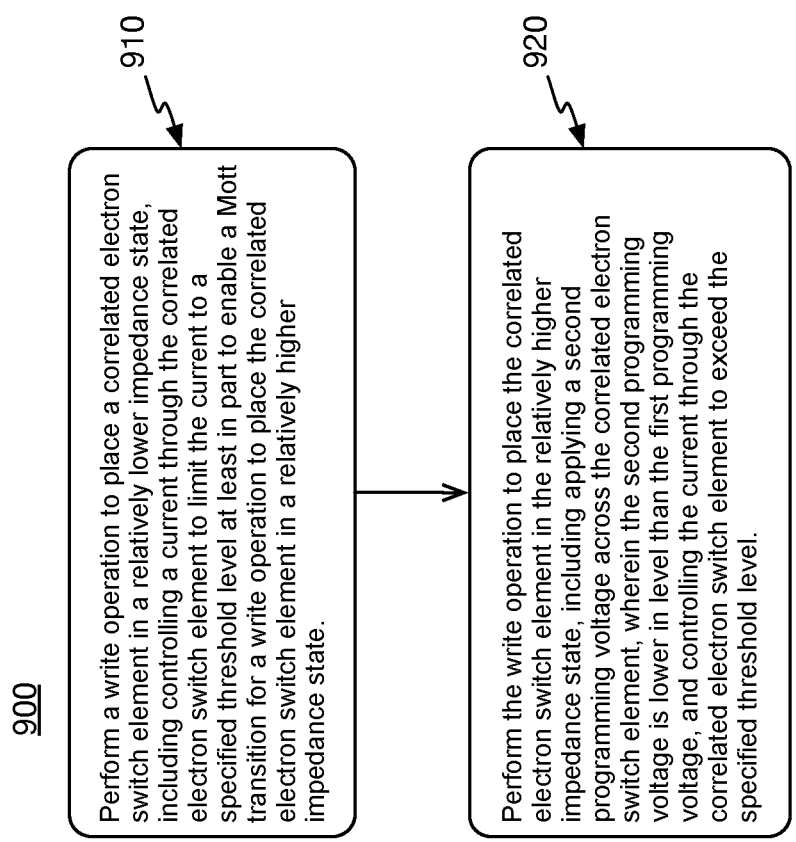
FIG. 9 depicts a simplified flowchart for an example process for programming one or more correlated electron switch elements, in accordance with an embodiment.

FIG. 9 depicts a simplified flowchart for an example process 900 for programming a CES element, in accordance with an embodiment. Embodiments in accordance with claimed subject matter may utilize all of blocks 910-920, fewer than blocks 910-920, or more than blocks 910-920. Also, the order of blocks 910-920 is merely an example order, and claimed subject matter is not limited in scope in these respects. At block 910, an operation to place a CES element in a relatively lower impedance state may be performed, including controlling a current through the CES element to limit the current to a specified threshold level at least in part to enable a Mott transition for a write operation to place the CES element in a relatively higher impedance state. In an embodiment, the write operation to place the CES element in the relatively lower impedance state may include applying a first programming voltage across the CES element.

Further, at block 920, a write operation to place the CES element in the relatively higher impedance state may be performed for the CES element. In an embodiment, the write operation to place the CES element in the relatively higher impedance state may include applying a second programming voltage across the CES element, wherein the second programming voltage is lower in level than the first programming voltage. Also, in an embodiment, the write operation to place the CES element in the relatively higher impedance state operation may include controlling the current through the CES element to exceed the specified threshold level.

Further, in an embodiment, controlling the current through the CES element to limit the current to the specified threshold level at least in part to enable the Mott transition for the write operation to place the CES element in the relatively higher impedance state may comprise locally throttling the current through the CES element. In an embodiment, locally throttling the current through the CES element may comprise under-driving an access device. For example, an access device may comprise an electronic switch, and under-driving the access device may comprise at least partially enabling the electronic switch via an enable signal that is lower in voltage level than the first programming voltage. Further, in an embodiment, an enable signal may be applied to the electronic switch via a word-line.

In an embodiment, controlling a current through a CES element to limit the current to the specified threshold level at least in part to enable the Mott transition for the write operation to place the CES element in the relatively higher impedance state may comprise globally throttling the current through the CES element. For example, globally throttling the current through the CES element may comprise adjusting the current level via one or more write driver circuits or via one or more supply voltage levels or a combination thereof.

In the context of the present disclosure, the term "connection," the term "component" and/or similar terms are intended to be physical, but are not necessarily always tangible. Whether or not these terms refer to tangible subject matter, thus, may vary in a particular context of usage. As an example, a tangible connection and/or tangible connection path may be made, such as by a tangible, electrical connection, such as an electrically conductive path comprising metal or other electrical conductor, that is able to conduct electrical current between two tangible components. Likewise, a tangible connection path may be at least partially affected and/or controlled, such that, as is typical, a tangible connection path may be open or closed, at times resulting from influence of one or more externally derived signals, such as external currents and/or voltages, such as for an electrical switch. Non-limiting illustrations of an electrical switch include a transistor, a diode, etc. However, a "connection" and/or "component," in a particular context of usage, likewise, although physical, can also be non-tangible, such as a connection between a client and a server over a network, which generally refers to the ability for the client and server to transmit, receive, and/or exchange communications.

In a particular context of usage, such as a particular context in which tangible components are being discussed, therefore, the terms "coupled" and "connected" are used in a manner so that the terms are not synonymous. Similar terms may also be used in a manner in which a similar intention is exhibited. Thus, "connected" is used to indicate that two or more tangible components and/or the like, for example, are tangibly in direct physical contact. Thus, using the previous example, two tangible components that are electrically connected are physically connected via a tangible electrical connection, as previously discussed. However, "coupled," is used to mean that potentially two or more tangible components are tangibly in direct physical contact. Nonetheless, is also used to mean that two or more tangible components and/or the like are not necessarily tangibly in direct physical contact, but are able to co-operate, liaise, and/or interact, such as, for example, by being "optically coupled." Likewise, the term "coupled" may be understood to mean indirectly connected in an appropriate context. It is further noted, in the context of the present disclosure, the term physical if used in relation to memory, such as memory components or memory states, as examples, necessarily implies that memory, such memory components and/or memory states, continuing with the example, is tangible.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second'" "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

Algorithmic descriptions and/or symbolic representations are examples of techniques used by those of ordinary skill in the signal processing and/or related arts to convey the substance of their work to others skilled in the art. An algorithm is, in the context of the present disclosure, and generally, is considered to be a self-consistent sequence of operations and/or similar signal processing leading to a desired result. In the context of the present disclosure, operations and/or processing involve physical manipulation of physical quantities. Typically, although not necessarily, such quantities may take the form of electrical and/or magnetic signals and/or states capable of being stored, transferred, combined, compared, processed and/or otherwise manipulated, for example, as electronic signals and/or states making up components of various forms of digital content, such as signal measurements, text, images, video, audio, etc.

It has proven convenient at times, principally for reasons of common usage, to refer to such physical signals and/or physical states as bits, values, elements, parameters, symbols, characters, terms, numbers, numerals, measurements, content and/or the like. It should be understood, however, that all of these and/or similar terms are to be associated with appropriate physical quantities and are merely convenient labels. Unless specifically stated otherwise, as apparent from the preceding discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing and/or network device. In the context of this specification, therefore, a special purpose computer and/or a similar special purpose computing and/or network device is capable of processing, manipulating and/or transforming signals and/or states, typically in the form of physical electronic and/or magnetic quantities, within memories, registers, and/or other storage devices, processing devices, and/or display devices of the special purpose computer and/or similar special purpose computing and/or network device. In the context of this particular disclosure, as mentioned, the term "specific apparatus" therefore includes a general purpose computing and/or network device, such as a general purpose computer, once it is programmed to perform particular functions, such as pursuant to program software instructions.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation. Likewise, a physical change may comprise a transformation in molecular structure, such as from crystalline form to amorphous form or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state from a binary one to a binary zero or vice-versa in a memory device may comprise a transformation, such as a physical, but non-transitory, transformation. Rather, the foregoing is intended as illustrative examples.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. A method, comprising:
performing a write operation to place a correlated electron switch device in a lower impedance state comprising controlling a current through the correlated electron switch device, at least in part by limiting a voltage applied to an access device coupled to the correlated electron switch device to a specified threshold voltage level, at least in part to establish a threshold current density level in the correlated electron switch device for a subsequent write operation to place the correlated electron switch device in a higher impedance state.

2. The method of claim 1, wherein the performing the write operation to place the correlated electron switch device in the lower impedance state further comprises applying a first programming voltage across the correlated electron switch device and the access device.

3. The method of claim 2, further comprising performing the subsequent write operation to place the correlated electron switch device in the higher impedance state, including:
applying a second programming voltage across the correlated electron switch device and the access device, wherein the second programming voltage is lower in level than the first programming voltage; and
controlling the current through the correlated electron switch device such that a current density in the correlated electron switch device to exceed the threshold current density level at least in part by controlling the voltage applied to the access device.

4. The method of claim 3, wherein the access device comprises a field-effect transistor.

5. The method of claim 3, wherein the limiting the voltage applied to the access device to the specified threshold voltage level at least in part to establish the threshold current density level in the correlated electron device for the subsequent write operation comprises locally throttling the current through the correlated electron switch device at least in part via controlling the voltage applied to the access device.

6. The method of claim 5, wherein the locally throttling the current through the correlated electron switch device comprises under-driving the access device.

7. The method of claim 6, wherein the access device comprises an electronic switch, and wherein the under-driving the access device comprises enabling the electronic switch via an enable signal that is lower in voltage level than the first programming voltage.

8. The method of claim 7, wherein the enable signal is applied to the electronic switch via a word-line.

9. The method of claim 4, wherein the limiting the voltage applied to the access device to the specified threshold voltage level at least in part to establish the threshold current density level in the correlated electron device for the subsequent write operation comprises globally throttling the current through the correlated electron switch device.

10. The method of claim 9, wherein the globally throttling the current through the correlated electron switch device comprises adjusting the current level via one or more write driver circuits or via one or more voltage supplies, or a combination thereof.

11. An apparatus, comprising:
one or more correlated electron switch devices; and
one or more electronic switch devices to control a current through the one or more correlated electron switch devices during a write operation to place the one or more correlated electron switch devices in a lower impedance state to limit the current to a specified threshold current level at least in part to establish a threshold current density in the one or more correlated electron switch devices for a subsequent write operation to place the one or more correlated electron switch devices in a higher impedance state.

12. The apparatus of claim 11, wherein, to perform the write operation to place the one or more correlated electron switch devices in the lower impedance state, a first programming voltage to be applied across the one or more correlated electron switch devices and the one or more electronic switch devices.

13. The apparatus of claim 12, wherein, to perform the subsequent write operation to place the one or more correlated electron switch devices in the higher impedance state, a second programming voltage to be applied across the one or more correlated electron switch devices and the one or more electronic switch devices, the second programming voltage to be lower in level than the first programming voltage, wherein the current density in the correlated electron switch devices to exceed the established threshold current density level.

14. The apparatus of claim 13, wherein the one or more electronic switch devices to individually comprise one or more field-effect transistors.

15. The apparatus of claim 13, wherein, to control the current through the one or more correlated electron switch devices, the current through the one or more correlated electron switch devices to be locally throttled at least in part via control of a voltage applied to one or more gate terminals of the one or more field-effect transistors.

16. The apparatus of claim 15, wherein, to locally throttle the current through the one or more correlated electron switch devices, the one or more field-effect transistors to be under-driven.

17. The apparatus of claim 16, wherein, to under-drive the one or more field-effect transistors, the one or more field-effect transistors to be enabled at least in part via an enable signal to be lower in voltage level than the first programming voltage.

18. The apparatus of claim 17, wherein the enable signal to be applied to the one or more field-effect transistors via one or more word-lines.

19. The apparatus of claim 13, wherein, to control the current through the one or more correlated electron switch devices, the current through the one or more correlated electron switch devices to be globally throttled.

20. The apparatus of claim 19, wherein, to globally throttle the current through the one or more correlated electron switch devices, the current level through the one or more correlated electron switch devices to be adjusted via one or more write driver circuits or via one or more voltage supplies, or a combination thereof.

* * * * *